(12) United States Patent (10) Patent No.: US 7,015,711 B2
Rothaug et al. (45) Date of Patent: Mar. 21, 2006

(54) APPARATUS AND METHOD FOR THE TESTING OF CIRCUIT BOARDS, AND TEST PROBE FOR THIS APPARATUS AND THIS METHOD

(75) Inventors: Uwe Rothaug, Marktheidenfeld (DE); Oleh Yuschuk, Wertheim-Reicholzheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

(21) Appl. No.: 10/981,079

(22) Filed: Nov. 4, 2004

(65) Prior Publication Data

US 2005/0083038 A1 Apr. 21, 2005

Related U.S. Application Data

(63) Continuation of application No. PCT/EP03/04468, filed on Apr. 29, 2003.

(30) Foreign Application Priority Data

May 7, 2002 (DE) ................................. 102 20 343

(51) Int. Cl.
*G01R 31/02* (2006.01)
(52) U.S. Cl. ...................... 324/758; 324/754; 324/757
(58) Field of Classification Search ........ 324/754–765, 324/158.1
See application file for complete search history.

(56) References Cited

U.S. PATENT DOCUMENTS 4,677,474 A * 6/1987 Sato et al. .................... 348/87

| 4,799,175 | A | 1/1989 | Sano et al. |
| 4,820,975 | A | 4/1989 | Diggle |
| 4,929,893 | A * | 5/1990 | Sato et al. .................... 324/758 |
| 5,091,692 | A * | 2/1992 | Ohno et al. ................. 324/758 |
| 5,113,133 | A | 5/1992 | Conti et al. |
| 5,394,100 | A * | 2/1995 | Bohler et al. ............... 324/758 |
| 5,644,245 | A | 7/1997 | Saitoh et al. |
| 5,804,982 | A | 9/1998 | Lo et al. |
| 5,977,776 | A | 11/1999 | Huth et al. |
| 6,344,751 | B1 | 2/2002 | Prokopp et al. |
| 6,496,361 | B1 * | 12/2002 | Kim et al. .................... 361/683 |
| 6,677,773 | B1 * | 1/2004 | Prokopp ...................... 324/761 |
| 6,734,687 | B1 * | 5/2004 | Ishitani et al. .............. 324/751 |
| 2003/0184332 | A1 * | 10/2003 | Tomimatsu et al. .......... 324/756 |

FOREIGN PATENT DOCUMENTS

DE 42 21 075 A1 1/1993

(Continued)

OTHER PUBLICATIONS

English translation of the International Preliminary Examination Report from International Patent Application PCT/EP2003/004468, filed Apr. 29, 2003.

*Primary Examiner*—Paresh Patel
(74) *Attorney, Agent, or Firm*—Houston Eliseeva LLP

(57) ABSTRACT

An apparatus and a method for the testing of circuit boards, together with a test probe for this apparatus and this method, in which the contact tips of a test finger of a finger tester are monitored during the testing process by an optical detection device and their movement, at least when approaching a part of the circuit board test points of a circuit board to be tested, is corrected on the basis of the result determined by the optical detection device in such a way that the contact tip makes reliable contact with the circuit board test point concerned. The correction data hereby obtained may be used in the calculation of calibration data.

34 Claims, 6 Drawing Sheets

FOREIGN PATENT DOCUMENTS

| | | |
|---|---|---|
| DE | 101 60 119 A1 | 10/2003 |
| EP | 0 468 153 A1 | 1/1992 |
| EP | 0 468 153 B1 | 1/1992 |
| EP | 0 853 242 A1 | 7/1998 |
| EP | 0 962 777 A2 | 12/1999 |
| WO | WO 92/11541 | 7/1992 |

* cited by examiner

APPARATUS AND METHOD FOR THE TESTING OF CIRCUIT BOARDS, AND TEST PROBE FOR THIS APPARATUS AND THIS METHOD

RELATED APPLICATIONS

This application is a Continuation of PCT/EP 03/04468, filed Apr. 29, 2003 (which was published in German under PCT Article 21(2) as International Publication No. WO 03/096037 A1), which claims priority to German Application No. DE 102 20 343.1, filed May 7, 2002, both applications being incorporated herein by reference in their entirety.

BACKGROUND OF THE INVENTION

Testers for the testing of circuit boards may in principle be divided into two groups, those with finger testers and those with parallel testers. The parallel testers are testers that, by means of an adapter, contact simultaneously all or at least the majority of the circuit board test points of a circuit board to be tested. Finger testers are testers for the testing of non-componented or componented circuit boards, which scan the individual contact points sequentially or serially using two or more test fingers. Serial testing with a finger tester is usually slower than parallel testing with a parallel tester.

The test fingers are generally fixed to a slide that may be moved along a cross-bar, while the cross-bar in turn is guided on and may be moved along guide rails. The slides may therefore be positioned at any desired point of a test array, which is usually rectangular. Equally, there are testers with stationary cross-bars, on which movable slides are provided. Arranged on these slides are test fingers that have a certain length and are fastened at one end pivotably to the slide. Through the swivel movement of the test finger, a certain area at right-angles to the cross-bar may be scanned. With both types of finger tester, all circuit board test points of a circuit board to be tested can be contacted and tested.

A finger tester is described in EP 0 468 153 A1 and a method of testing circuit boards using a finger tester is described in EP 0 853 242 A1.

The key factor enabling a finger tester to be successful in the market is the speed with which a circuit board to be tested is tested. In order to accelerate this test rate, special test methods (e.g. EP 0 853 242 A1 and the corresponding U.S. Pat. No. 5,977,776) or special test probes (e.g. U.S. Pat. No. 5,804,982 or U.S. Pat. No. 6,344,751) have already been developed. A test probe of this kind for the rapid contacting of a circuit board test point of a circuit board to be tested is disclosed by U.S. Pat. No. 5,113,133.

With conventional finger testers, two calibration processes are performed before the actual testing of the circuit board to be tested. In a first testing process, the test heads, each comprised of a slide and a contact finger, are calibrated with reference to the tester, and in a second calibration process, the computer aided design (CAD) data of a circuit board to be tested are brought into agreement with an actual circuit board that is inserted in the tester.

In the first calibration process, a calibration plate is inserted in the tester. This calibration plate is a large circuit board on the surface of which a grid is formed by means of the conductor paths. The individual conductor paths are arranged relative to one another with a spacing of, for example, 1–3 centimeters (cm). Only in the edge zone of this calibration plate is a very wide conductor path formed, which is in electrical contact with all other conductor paths. In the calibration process, one of the test fingers is placed on the wide conductor path, and the intersection points of the grid are scanned using another test finger. When an intersection point of the grid is touched, the coordinates of the test finger and the slide are stored, and correlated with the coordinates of the corresponding intersection point of the calibration plate. The location of the individual intersection points is effected by a step-wise approach to the intersection point, until a conductive connection is made across the two contact fingers and the conductor paths of the calibration plate. This step-wise approach may be made for example in a circular or spiral manner. For each test measurement, this involves the test finger being lowered onto and then lifted up from the calibration plate. Some ten test measurements may be necessary to locate a grid point. If all grid points off the calibration plate have been detected successfully then, for the individual sections of the test area, different correction values for driving the test fingers of the tester are determined and stored. These correction or calibration values make it possible for a test finger to be driven precisely in a coordinate system of the tester, and for it to be placed in the test area.

The second calibration process is generally performed for each circuit board to be tested. In this process, the circuit board of the batch is inserted in the tester and then, using the test fingers, prominent circuit board test points of the pattern of circuit board test points to be tested are detected and their position in the tester determined. When the circuit board test points have been detected, then the CAD data of the circuit board test points of the circuit board to be tested can be brought into agreement with the coordinates of the physical circuit board, i.e., the distortions and misalignments of the circuit board test point pattern determined as typical for a batch are recorded.

When both calibration processes have been completed, then the circuit board test points of the circuit board to be tested may be successfully approached, and contacted by means of the test fingers.

The first calibration process is necessary each time the tester is set up afresh, e.g., if a test finger has been replaced or if the tester is reconfigured at the start of a working day. The first calibration process is also performed each time the ambient temperature changes by, for example, more than 3° C.

Both calibration processes take up a considerable amount of time, which cannot be used for actual testing of circuit boards. Consequently, in the testing of circuit boards, these calibration processes have an adverse effect on throughput.

WO 92/11541 discloses an imaging system for a device for the testing of circuit boards. Similarly to an X-Y recorder, this imaging system has a movable cross-bar, on which is mounted a test head with a vertically movable test needle. Mounted next to the test needle is an imaging device comprising a lens and a charge coupled device (CCD) element. The image generated by the imaging device is displayed on a monitor. With the aid of the image displayed on the screen, an operator can control the test head in such a way that during a teach-in process, he traces all of the contact points to be tested and programs the relevant coordinates. During the test, the device automatically traces the individual contact points and contacts them with the test needle.

SUMMARY OF THE INVENTION

The present invention relates to an apparatus and a method for the testing of circuit boards, together with a test probe for this apparatus and this method.

The invention can be used to improve the reliability with which test points are contacted by an apparatus and a method for the testing of circuit boards by means of test fingers, with less calibration time than is required for conventional finger testers. The invention is also based on the problem of providing a test probe for this apparatus and this method.

According to the invention, the contact tips are monitored during the testing process by an optical detection device, and their movement at least when approaching a part of the circuit board test points of a circuit board to be tested is automatically corrected by the result determined by the optical detection device in such a way that the contact tips make reliable contact with the circuit board test point concerned. As a result, circuit board test points are exactly contacted even if the relevant positioning data have not yet been calibrated or precisely calibrated.

Calibration data may be calculated from the correction data provided by this process.

These calibration data replace the two calibration processes usually undertaken with conventional finger testers, since they determine clearly the relationship between the contact tips of the test fingers and the physical circuit board test points of the circuit board to be tested.

With the apparatus according to the invention and the method according to the invention, the calibration process is performed together with the actual testing or measuring process, without any considerably delay to the latter. This represents a significant acceleration in the method of testing circuit boards using a finger tester, and considerably increases the throughput of circuit boards to be tested.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
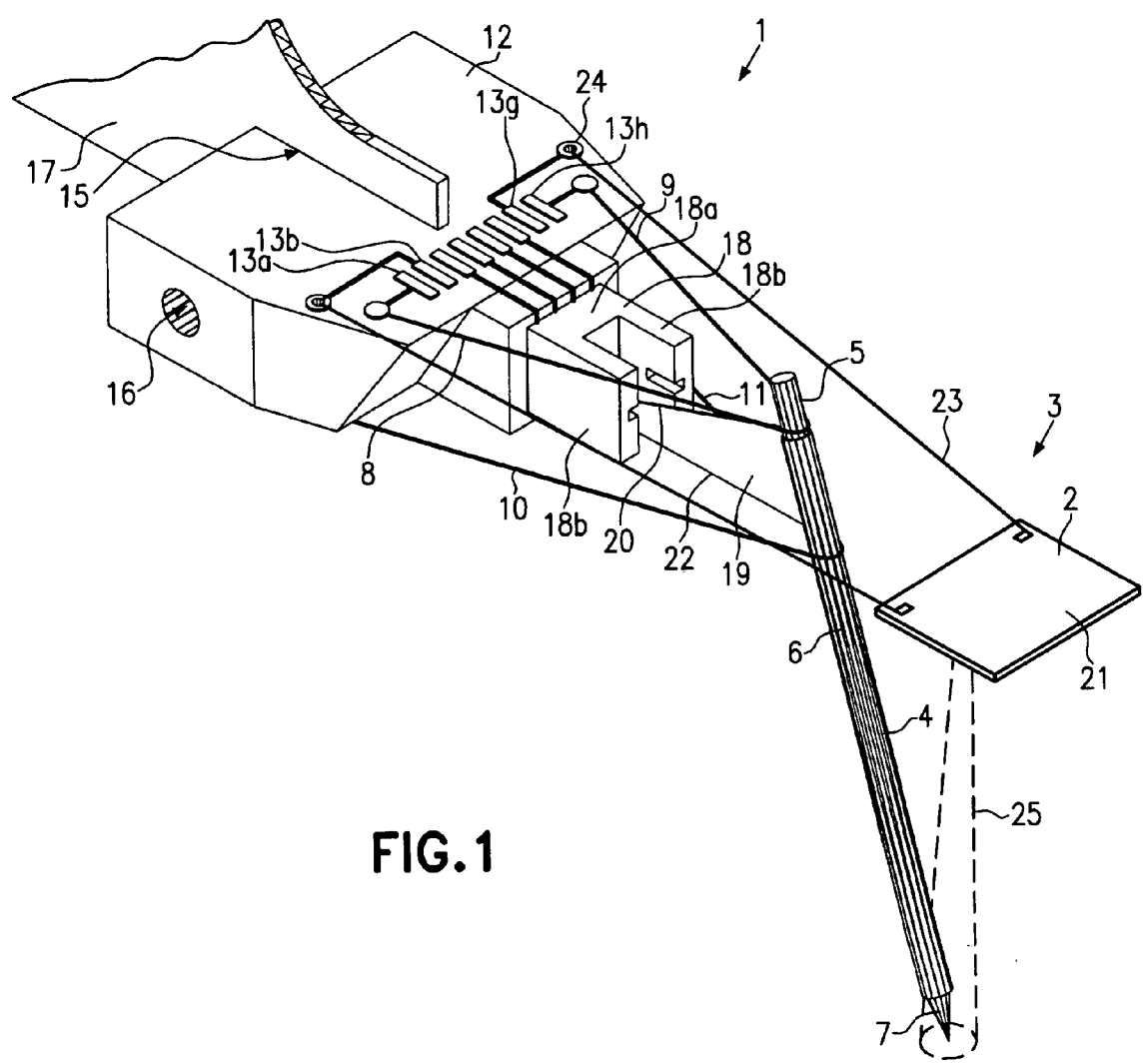
FIG. 1 a test probe according to the invention with a camera chip.
Figures 2, 3:
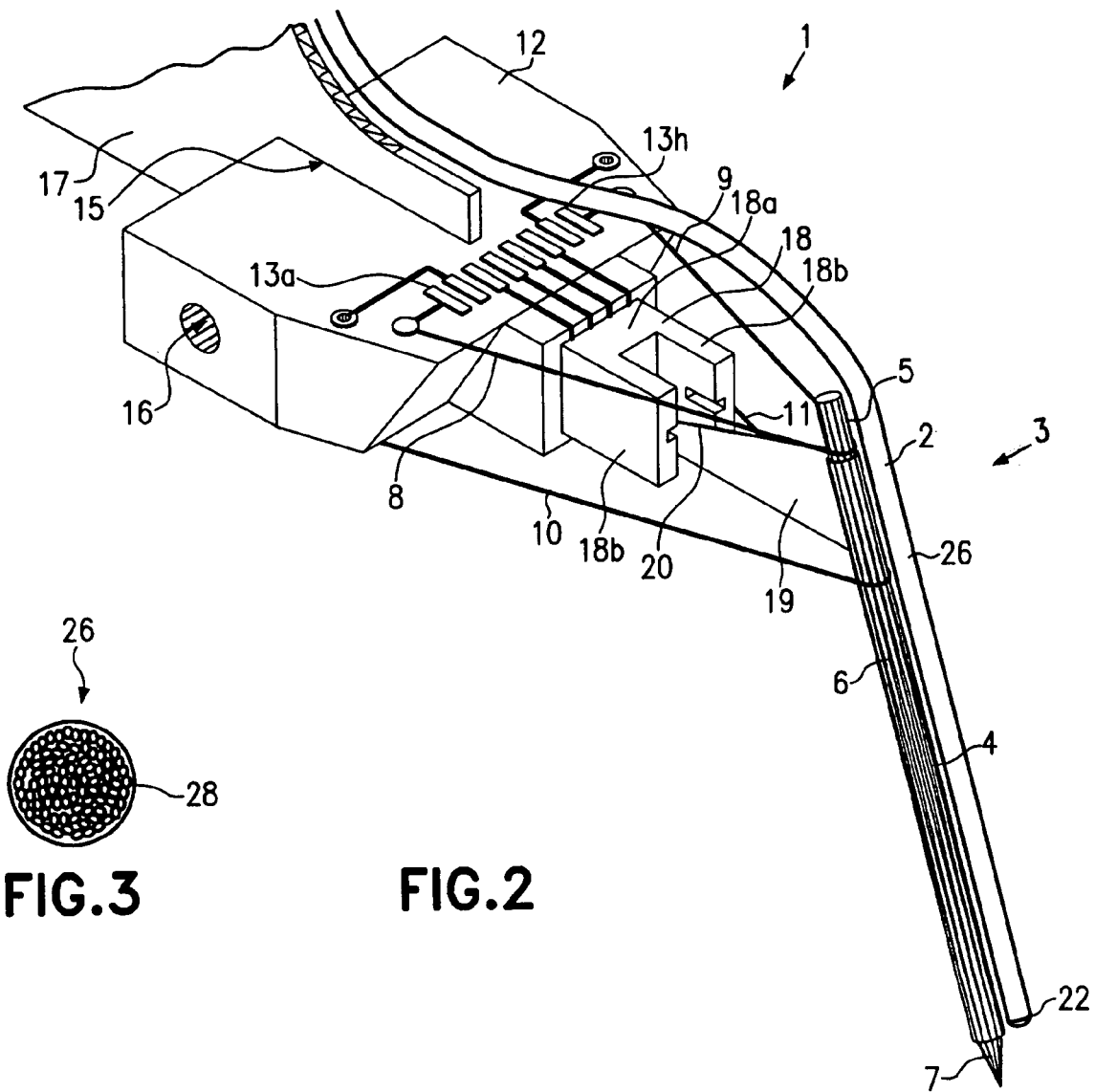
FIG. 2 a test probe according to the invention with an optical fiber cable.
FIG. 3 a schematic sectional view through an optical fiber cable.

FIGS. 1 and 2 show two different embodiments of test probes 1, which have been constructed according to the principles of the present invention.

Each of these test probes 1 has an optical receiver device 2 of an optical detection device 3. The basic structure of this test probe 1, apart from the optical receiver device, is described in U.S. patent application Ser. No. 10/859,759, filed on Jun. 3, 2004, entitled Test Probe For Finger Tester and Corresponding Finger Tester, by Victor Romanov, which is incorporated herein in its entirety by this reference. (See also German patent application DE 101 60 119.0.) Reference is therefore made to this patent application.

The test probe 1 has a test needle 4, formed in the present embodiment by a needle 5 with a diameter d of 0.3–0.5 millimeters (mm). The needle 5 is mad of, for example, steel or tungsten. The needle 5 is coated with an insulating layer, for example polytetrafluoroethylene, also known as Teflon® coating. The coating is in turn covered by an electrically conductive layer. This covering with an electrically conductive layer forms a shield 6, which shields the needle 5 against electrical fields. Both ends of the needle 5 protrude from the shield 6, with one of the two ends tapering to a point and designed to form a contact tip 7. At the end opposite the contact tip 7, the test needle 4 or needle 5 is connected to two retaining arms 8, 9, subsequently referred to as the upper retaining arms 8, 9. Two further retaining arms 10, 11 are attached to the shield 6 a short distance from the connection point between the upper retaining arms 8, 9 and the test needle 4. The retaining arms 10, 11 are described as lower retaining arms 10, 11. Each of the two pairs of retaining arms 8, 9 and 10, 11, respectively, are made of a wire element bent in the middle, with the test needle 4 attached at the bending point by means of an electrically conductive connection, such as for example a soldered connection. The two pairs of retaining arms 8, 9 and 10, 11 respectively thus form in each case an isosceles triangle, with the test needle 4 located at the apex of the isosceles triangle.

At their ends, which are furthest away from the test needle 4, the retaining arms 9–11 are fastened to a mount 12. The mount 12 is an electrically insulating plastic part, provided on its top with a series of contact pads 13a–13h. Each of the upper retaining arms 8, 9 is connected electrically via conductor paths to the contact pads 13a and 13h, respectively. Each of the lower retaining arms 10, 11 is connected electrically by contact pads (not shown) formed on the bottom of the mount 12.

These contact pads are connected by further conductor paths (not shown) to an electrical plug connector (not shown) formed on the mount 12. The mount 12 is formed as a plug-in element, which may be inserted into a test head of a finger tester. In the present embodiment, the mount 12 has a slot 15 which leads to the side face of the mount 12 which is furthest from the test needle 4. The mount 12 also has a through-hole 16 arranged at right-angles to the slot 15. The mount 12 can thus be pushed by the slot on to a thin wall 17 of the test head and fixed by means of a pin passing through the through-hole 16 of the mount and a corresponding through-hole in the wall 17. When the mount 12 is slid or placed on the wall 17 of the test head, the conductor paths connected to the contact pads are at the same time electrically connected to the corresponding conductor paths of the test head.

On the mount 12, a photoelectric switch element 18 is mounted on the side face adjacent to the test needle 4. Viewed from above the photoelectric switch element 18 is U-shaped with a base 18a and two limbs 18b. On the inside of the end section of one of the two limbs 18b is a light source, while the other limb 18b is provided with a light sensor, which receives the light signal. The light source and the light sensor thus form an optical measuring section. Fastened to the test needle 4 is a measuring vane 19, made for example from a thin metal sheet. This measuring vane lies in a longitudinal center plane of the test probe 1, which is aligned vertically and forms the mirror plane to the retaining arms 8 and 9, and 10 and 11 respectively. The upper edge of the measuring vane 19 is designed as a measuring edge 20 and, when the test needle 4 moves relative to the mount 12, is moved into the optical measuring section, so that the electrical measuring signal of the optical measuring section reproduces the position of the test needle 4 relative to the mount 12.

The test probe according to FIG. 1 has an optical receiver device 2 in the form of a camera chip 21, which is fastened to the mount 12 at two soldered joints 24 by means of two retaining arms 22, 23. The retaining arms 22, 23, made for example of wire, serve as electrical conductors and are each led by means of further conductors from the soldered joint 24 to the contact pads 13b and 13g respectively. The retaining arms 22, 23 serve as electrical leads to the camera chip 21. Since a camera chip generally has more than two electrical connections, it is expedient to provide further electrical conductors and individual connections at the retaining arms 22, 23. On that side of it which is directed towards the contact tip 7, the camera chip 21 has an optically sensitive sensor field, which is usually a CCD sensor. A lens is provided on the sensor field, so that an object within the viewing cone 25 is optically imaged on the sensor field and converted by the camera chip into an electrical video signal. The camera chip 21 is arranged so that the contact tip 7 is located in the viewing cone 25. The contact tip 7 is thus detected optically by the camera chip 21.

An alternative embodiment of the test probe according to the invention is shown in FIG. 2. This test probe is substantially the same in structure as the test probe of FIG. 1, so that identical parts are given the same reference numbers. Provided instead of the camera chip is an optical fiber cable 26, which is attached to the test needle 4. The optical fiber cable 26 is arranged with its free end 27, on which a lens is provided, adjacent to the contact tip 7. The optical fiber cable 26 is comprised of many parallel optical fibers 28 (FIG. 3). The optical fibers 28 located in the edge area of the optical fiber cable 26 are connected, by that end of them which is furthest from the contact tip, to a light source, so that the light from the light source is fed to an area of the contact tip 7. The light reflected and/or emitted from the contact tip 7 and the surrounding area is received by the other optical fibers 28 and fed to a camera (not shown). The contact tip 7 can thus also be optically detected via the optical fiber cable 26 and a corresponding image in the form of electrical signals can be generated.

Figure 4:
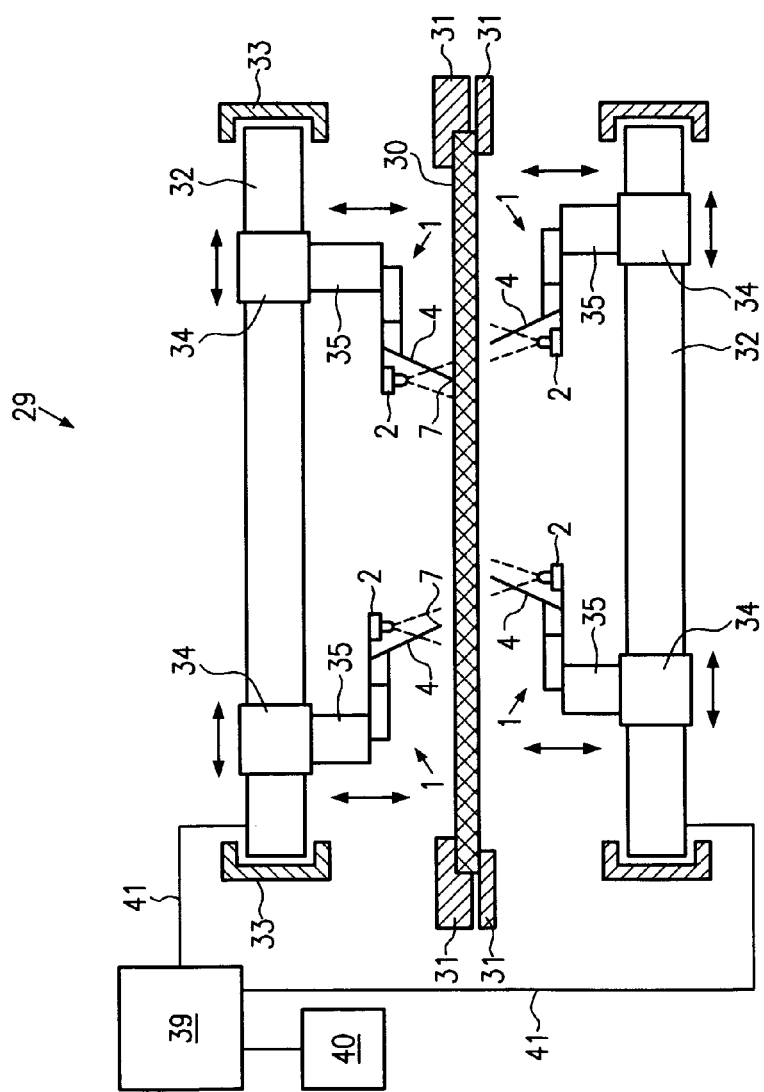
FIG. 4 a schematic sectional view of a finger tester according to the invention, FIG. 5 a schematic view of the movement of a test probe in performing the method according to the invention, FIG. 6 a flow chart of the method according to the invention (Key: S1—Start, S2—Positioning movement, S3—Optical detection, movement towards the circuit board and correction movement, S4—Determination of calibration data, S5—All selected circuit board test points tested), FIG. 7 a schematic sectional view of a further embodiment of a tester according to the invention, and FIG. 8 an enlarged detail view of a circuit board to be tested.

FIG. 4 shows in schematic form an apparatus 29 for the testing of circuit boards 30. This apparatus or test apparatus 29 is a finger tester. The circuit board 30 to be tested is held by a mounting frame 31. This mounting frame 31 defines a rectangular, flat-surfaced mounting area for holding a circuit board. This mounting area forms a test array in which circuit board test points of a circuit board to be tested may be contacted. Provided in the area above and below the mounting area are cross-bars 32 which extend beyond the mounting area. Preferably in each case several cross-bars, aligned parallel to one another, are arranged above and below the mounting area. The cross-bars 32 are held by their ends in rails 33 which run at right-angles to the plane of the drawing of FIG. 4, i.e. at right-angles to the cross-bars 32 and parallel to the plane of the mounting area. The cross-bars 32 may be designed to be moveable in the rails 33.

Mounted on each of the cross-bars 32 in the present embodiment are two inner slides 34, which may be moved to and from along the cross-bars. Fitted on each of the slides 34, on the side facing the mounting area, is a test head 35. Mounted on each test head 35, on the end facing the mounting area, is a test probe 1, as shown in FIG. 1. The test head 35 is designed to be movable on the slide 34 in a direction at right-angles to the circuit board 30 to be tested and at right-angles to the plane of the mounting area. For this purpose a linear motor may be provided, as described for example in U.S. patent application Ser. No. 10/859,759 or German patent application DE 101 60 119.0. Instead of the linear motor, another kind of adjusting mechanism may in principle also be used. The test head 35 may also be provided with a rotating mechanism so that the test probe 1 representing the test finger may be swivelled around an axis at right-angles to the circuit board 30. In the case of such an embodiment, the cross-bars 32 may be made to be stationary.

The test apparatus 29 has a control unit 39 which is linked to a combined detection/analysis unit 40. The control unit 39 is connected by wiring 41 to the operating elements (slide 34, test head 35) and the sensors (camera 2, test needle 5) of the test apparatus 29. The control unit controls automatically the movement of the test needle 5 for contacting circuit board test points on the circuit board 30 to be tested. The detection/analysis unit 40 receives the optical signals from the camera 2 and analyses them automatically, as described in detail below. The control unit 39 controls the movement of the test needle 5 on the basis of the data determined by the detection/analysis unit 40.

Figure 5:
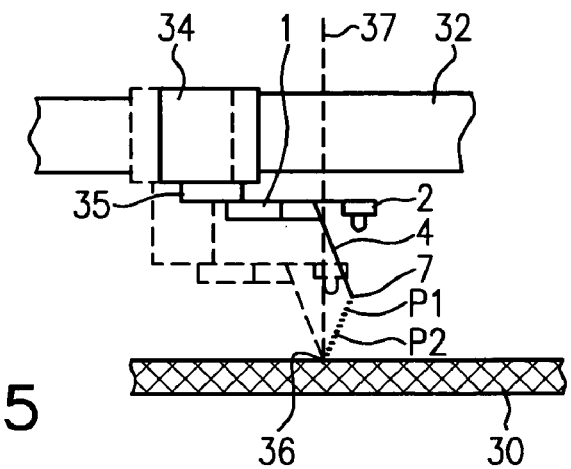
Figure 6:
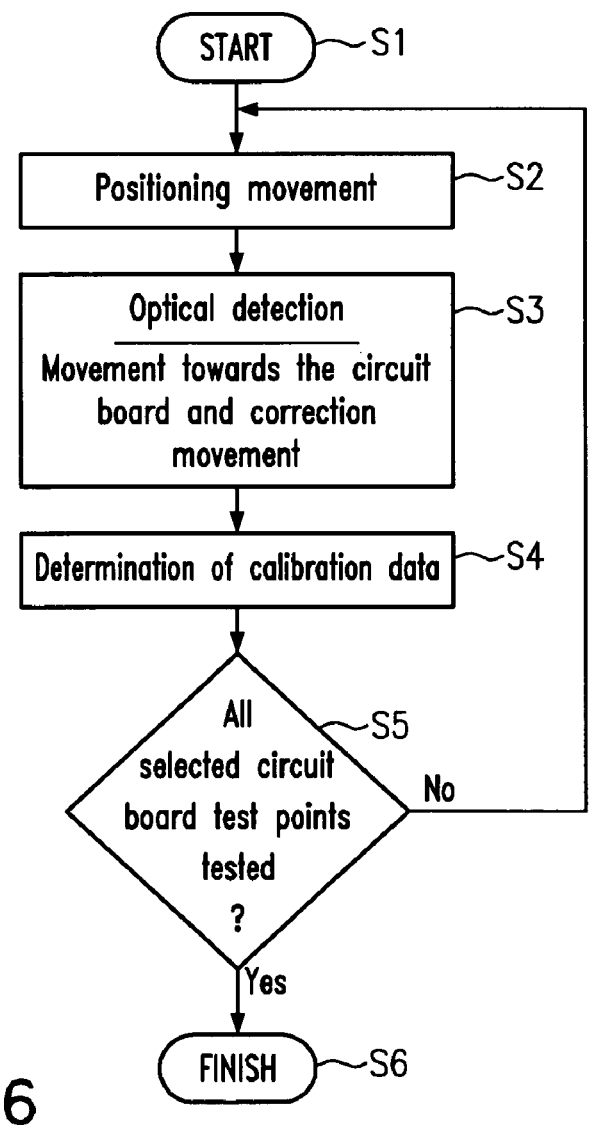

The mode of operation of the apparatus according to the invention is explained below with the aid of FIGS. 5 and 6. FIG. 5 shows in schematic form a detail of the tester of FIG. 4 together with a detail of the circuit board, wherein the test head 35 is shown in the position furthest removed from the circuit board 30 (hatched lines), and in a position in which the test needle contacts the surface of the circuit board (broken line).

The process begins (step S1) after a circuit board, in particular the first circuit board of a batch of circuit boards to be tested, has been inserted in the tester.

A positioning movement (S2) is then performed, in which the test probe is moved parallel to the plane of the circuit board 30 to be tested until the contact tip 7 is located approximately in the area of a solder 37 standing on a circuit board test point 36. If the tester has not yet been calibrated, triggering of the positioning movement results in a deviation similar to that shown in FIG. 5 between the solder 37 and the contact tip 7, in the position with clearance from the circuit board 30.

Using the optical detection device, i.e. the camera chip 21 and a suitable evaluation device, an image of the probe tip against the background of the circuit board is made (S3) and this image is used to determine the distance of the probe tip 7 from the centre of the circuit board test point 36. A correcting movement is then made to bring the probe tip 7 closer to the solder 37. At the same time as the correction movement, or before or after it, the test probe is moved a short distance towards the circuit board 30. After these two movement components have been performed, the probe tip 7 is a little closer to the solder 37 and a little closer to the circuit board 30 to be tested at point P1. At this point the probe tip is again detected against the background of the circuit board 30 to be tested, and the distance from and direction to the centre of the circuit board test point to be contacted are determined. A further correction movement is then made, accompanied by a movement towards the circuit board 30. The probe tip 7 is now at another point P2, which in turn is closer to the solder 37 and the circuit board 30 than P1. Here once again the probe tip 7 is recorded against the background of the circuit board 30 to be tested, and the distance from the centre of the circuit board test point 36 is determined. This is followed by a further correction movement, and the test probe is moved on to the circuit board 30 until the probe tip 7 lies on the circuit board test point 36. The contacting of a circuit board 30 by the probe tip 7 or test needle 4 is detected at the test probe 1 by means of the measuring vane 19 and the photoelectric switch element 18 (FIGS. 1 and 2).

The vector sum of all correction movements gives the amount and the direction of the distance of the contact tip 7 in its original position from the solder 37. This distance value is stored and used for calculating calibration data (S4) which are used in fresh movement of a test probe to a circuit board test point.

Figure 8:
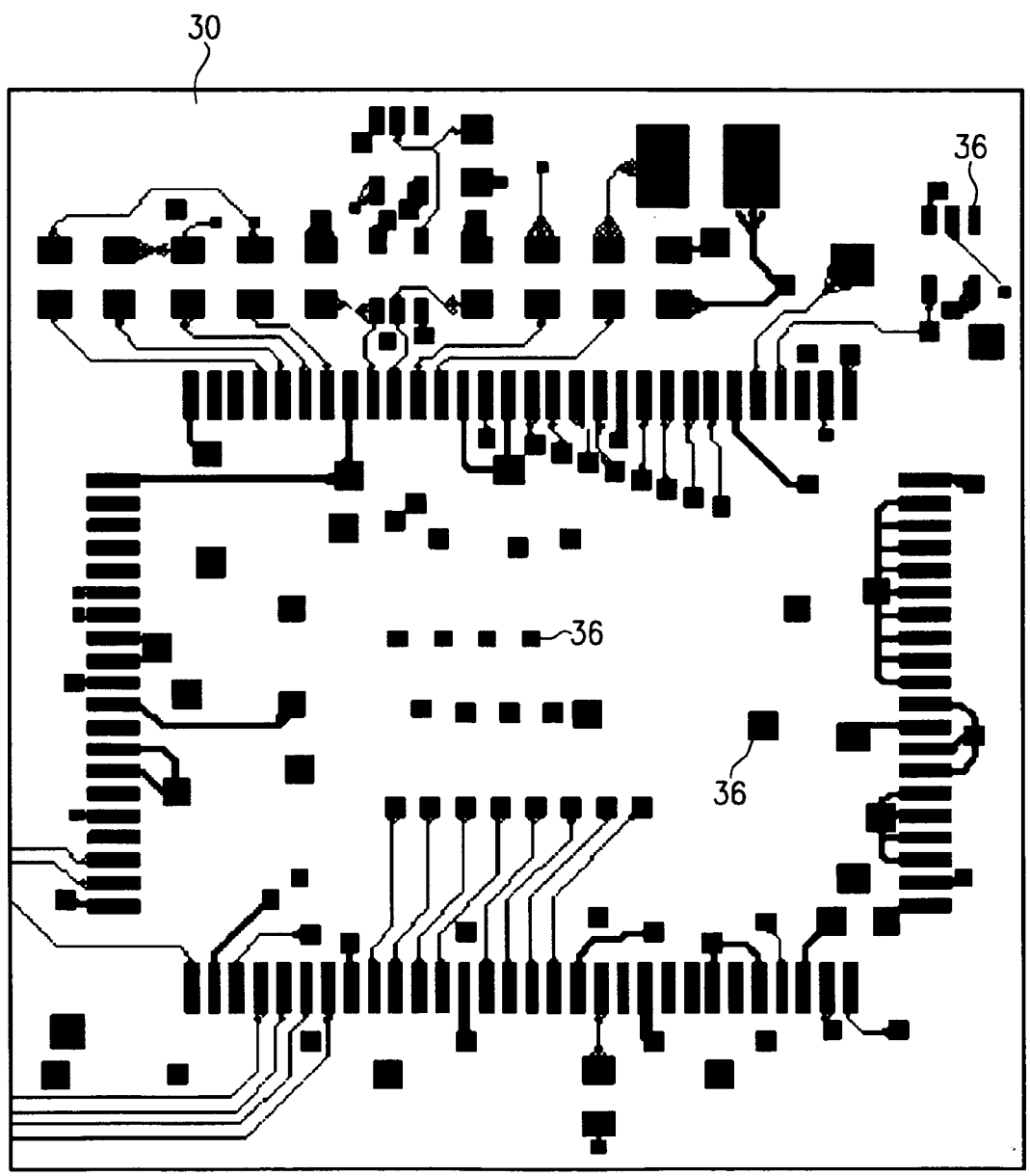

This method is used for a predetermined selection of circuit board test points 36 of the circuit board 30 to be tested. These circuit board test points 36 are particularly distinctive, i.e. they are not confused with other circuit board test points when the not yet calibrated tester makes its approach. Some circuit board test points are for example in a larger area of individually arranged circuit board test points. A larger area is understood as being for example an area of one square centimeter or more. Moreover such distinctive circuit board test points 36 may be circuit board test points located at the edge of a group of circuit board test points and therefore easily identifiable on the image recorded by the camera chip 21 (FIG. 8). In step S5 a check is made as to whether or not all selected circuit board test points 36 have been tested. If this is not the case, then another of the selected circuit board test points 36 is approached with the test probe, with the correction movements described above once again being performed so that the circuit board test point may be reliably contacted by the contact tip 7. Calibration data are again determined from the relevant distance values.

Step S5 establishes that all selected circuit board test points have been tested, meaning that all calibration data have been determined. The process of approaching the selected circuit board test points may thus be concluded (S6). Further circuit board test points and further circuit boards of the batch are then tested in the usual manner.

In the method according to the invention, the individual circuit board test points are approached automatically, while with the aid of the recorded image containing the probe tip and the circuit board test point to be contacted, the distance of the probe tip from the centre of the circuit board test point is automatically determined and a suitable correction movement is automatically performed. By this means circuit board test points are correctly contacted even if the position data are not exactly calibrated or if there are deviations in the position of the circuit board test points from their ideal position. Consequently the reliability of contacting a circuit board test point is markedly increased by the method according to the invention.

The control unit of the tester is so designed that the test probe is moved to a specific point through the input of defined input coordinates. Using the method according to the invention, these input coordinates are linked to the actual positions of the selected circuit board test points, and from this the calibration data are calculated. By this means, in one step the tester itself is both calibrated and also linked up with the CAD data of the circuit board to be tested. Thus the two calibration processes described earlier are replaced by a single calibration process, which is also executed in the actual testing of the circuit board. The method according to the invention of approaching a selected circuit board test point is only a half to two seconds longer than approaching with an already calibrated apparatus, so that the whole testing process is delayed by around half a minute to three minutes, depending on the number of selected circuit board test points, as compared with testing by the calibrated apparatus. This represents a significant acceleration in testing with finger testers when compared with conventional methods in which the tester must first be calibrated before actual testing can commence.

In the method described above with the aid of FIGS. 5 and 6, in each case three images are taken and analyzed in approaching a circuit board test point 36. Within the scope of the invention it is however possible to take just a single image and then to approach the circuit board test point 36 immediately and correctly, if the resolution of the camera is sufficiently high. If however the deviations are greater or the resolution of the optical detection device is lower, it may also be expedient to record several images and to take a corresponding number of correction steps. The recording of an image by the camera chip takes around 30 milliseconds. This indicates that the recording of the image delays the overall process only slightly.

Within the scope of the present invention it may also be expedient for the tester to be calibrated with the aid of a first circuit board of a batch with a number of for example ten to 100 selected circuit board test points. With further circuit boards to be tested, only two to ten selected circuit board test points are approached in accordance with the method according to the invention, so that by this means the position in the tester of each circuit board to be tested is verified. In the course of calibration by means of ten to 100 circuit board test points, misalignments, warpage and/or distortions in the arrangement of the circuit board test points are determined. Such misalignments, warpage and/or distortions in the arrangement of the circuit board test points are described in detail in international patent application WO 02/21893 A2, for which reason WO 02/21893 A2 is incorporated by reference into the present patent application. It may be expedient to reduce in stages the number of circuit board test points to be taken into account in the calibration process, e.g. by five to 20 circuit board test points in each case. If during the testing of a circuit board a faulty contact should occur between a test finger and a circuit board test point, then the number of circuit board test points to be taken into account in calibration may be increased again. It is even expedient, after a faulty contact, to revert to the maximum number of circuit board test points to be taken into account in calibration.

The minimum number of circuit board test points to be taken into account is two for each side of the circuit board, since with two points the arrangement of the circuit board test points in the testing plane is determined precisely. If it is desired to determine the layout of the circuit board precisely in three-dimensional space, then at least three circuit board test points need to be taken into account in calibration. It may however also be expedient to calibrate each circuit board using at least four to ten circuit board test points.

The use of test probes with integral optical receiver device requires no additional mechanisms for camera operation, as is the case with conventional finger testers which calibrate the tester by means of a camera.

Figure 7:
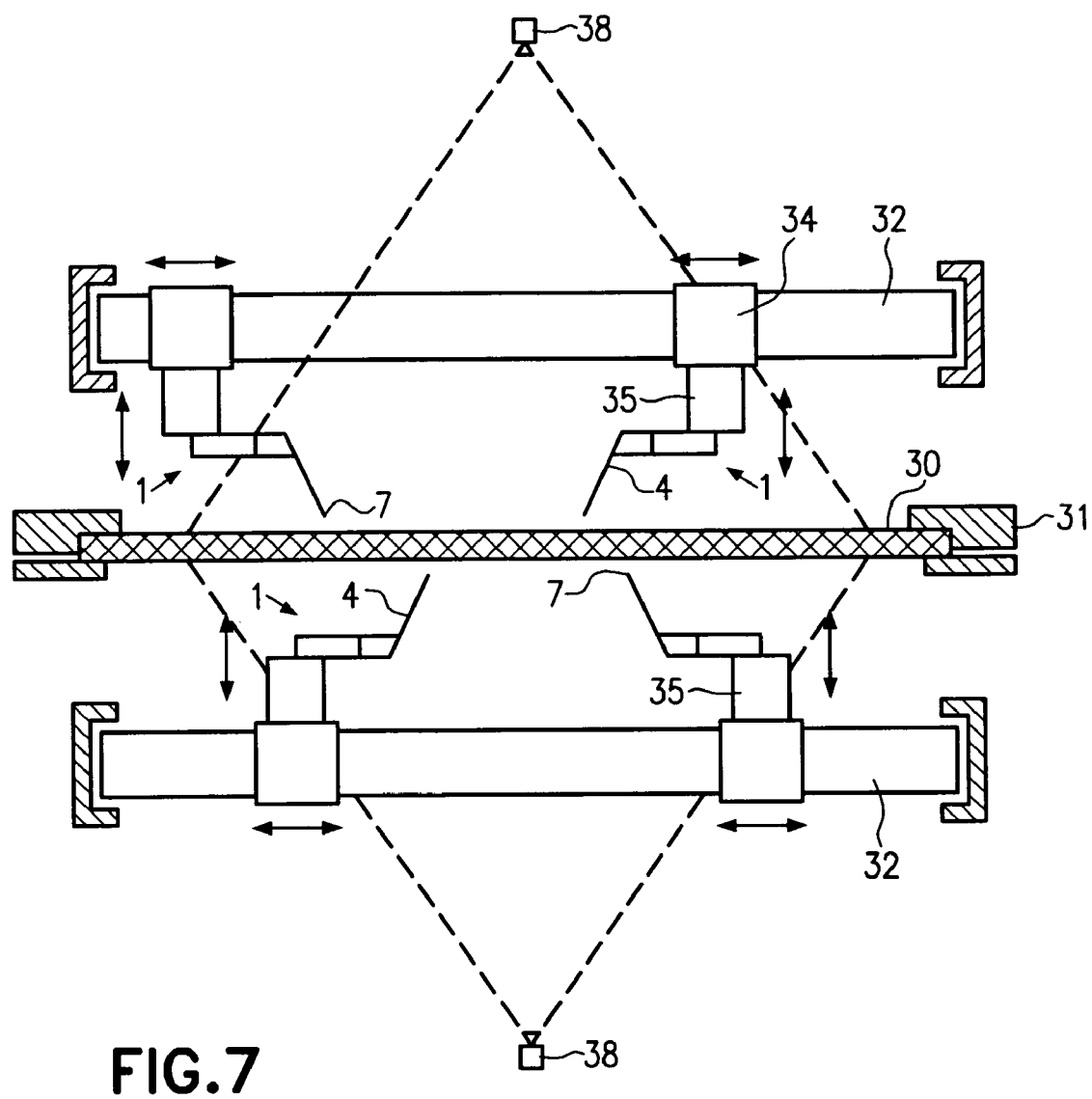

In the examples of apparatus described above, the optical receiver device is in each case mounted on the test probe 1. FIG. 7 shows an embodiment in which a camera 38 is provided for each side of the mounting area, with static mounting in the area outside the cross-bars 32. The contact tips 7 of the test probes 1 may be detected by each camera 38. This design is much simpler in mechanical terms than that of the apparatus variants described above. However it requires a very high-resolution camera with a good lens, so that the point of the contact tip 7 may be detected with the necessary accuracy from for example 0.05 mm. Moreover the selected circuit board test points must be so chosen that, when they are approached, the contact tip is not concealed from the camera 38 by a cross-bar or other part of the tester. Otherwise the method according to the invention may be performed in the same manner as that described above.

While this invention has been particularly shown and described with references to preferred embodiments thereof, it will be understood by those skilled in the art that various changes in form and details may be made therein without departing from the scope of the invention encompassed by the appended claims.

LIST OF REFERENCES: 1—test probe, 2—optical receiver device; 3—optical detection device, 4—test needle, 5—needle, 6—shield, 7—contact tip, 8—retaining arm, 9—retaining arm, 10—retaining arm, 11—etaining arm, 12—mount, 13a–13h—contact pads, 14—conductor path, 15—slot, 16—through hole, 17—wall, 18—photoelectric switch element, 19—measuring vane, 20—measuring edge, 21—camera chip, 22—etaining arm, 23—retaining arm, 24—soldered joint, 25—viewing cone, 26—optical fiber cable, 27—free end, 28—optical fiber, 29—apparatus, 30—circuit board, 31—mounting frame, 32—cross-bar, 33—rail, 34—slide, 35—test head, 36—circuit board test point, 37—solder, 38—camera, 39—control unit, 40—detection/analysis unit.

What is claimed is:

1. Apparatus for the testing of circuit boards, comprising:
a mounting area for holding a circuit board to be tested;
test fingers for serially contacting of circuit board test points of a circuit board to be tested with contact tips, wherein the test fingers are capable of being moved along the surface of a circuit board to be tested by a movement device and being lowered so that the contact tips contact the circuit board;
an optical detection device for the optical detection of at least one of the contact tips of the test fingers, optical detection device moving with the contact tip at least in a direction along the surface of the circuit board to be tested;
an analysis unit to record an image of the at least one contact tip and to determine the distance of the contact tip from the center of a circuit board test point to be contacted, and
a control unit to control the movement of the contact tip on the basis of the distance of the contact tip from the circuit board test point to be tested, as determined by the analysis unit.

2. Apparatus according to claim 1, comprising a device for moving the contact tip and the optical detection device approximately at right-angles to the surface of a circuit board to be tested.

3. Apparatus according to claim 2, wherein the device for moving the contact tip approximately at right-angles to the surface of a circuit board has a linear motor.

4. Apparatus according to claim 3, comprising cross-bars which span the mounting area and on which in each case at least one slide is movably mounted and on each slide at least one test finger is mounted.

5. Apparatus according to claim 4, wherein the cross-bars are capable of being moved at right-angles to their longitudinal extent and/or the test fingers are designed to move at right-angles to the longitudinal extent of the cross-bars.

6. Apparatus according to claim 5, wherein the contact tips of the test fingers are in each case formed on a test probe, and at least one of the test probes is provided with a receiver device of the optical detection device.

7. Apparatus according to claim 6, wherein the receiver device is a camera chip.

8. Apparatus according to claim 6, wherein the receiver device is an optical fiber cable.

9. Apparatus according to claim 1, comprising cross-bars which span the mounting area and on which in each case at least one slide is movably mounted and on each slide at least one test finger is mounted.

10. Apparatus according to claim 9, wherein the cross-bars are capable of being moved at right-angles to their longitudinal extent and/or the test fingers are designed to move at right-angles to the longitudinal extent of the cross-bars.

11. Apparatus according to claim 1, wherein the contact tips of the test fingers are in each case formed on a test probe, end at least one of the test probes is provided with a receiver device of the optical detection device.

12. Apparatus according to claim 11, wherein the receiver device is a camera chip.

13. Apparatus according to claim 11, wherein the receiver device is an optical fiber cable.

14. Apparatus according to any of claims 1, wherein the optical detection device has a camera.

15. Apparatus according to claim 1, wherein the control unit that executes a positioning movement of one of the contact tips, which is arranged at a distance from the surface of a circuit board to be tested, wherein the contact tip is moved parallel to the surface of the circuit board until the contact tip is positioned approximately on a solder standing vertically in the center of a circuit board test point; executes movement of the contact tip at right-angles to the surface of the circuit board to be tested wherein the optical detection device determines the position of the contact tip relative to the circuit board test point to be contacted at least once, and the movement device for executing a correction movement directed parallel to the surface of the circuit board to be tested is driven in such a way that the contact tip is moved towards the solder.

16. Apparatus according to claim 15, wherein from the direction and amount of the correction movement, calibration data are determined for use in subsequent positioning movements.

17. Apparatus according to claim 15, wherein the correction movement for correcting the position of a contact tip is executed in several movement steps wherein, between the individual movement steps, the position of the probe tip relative to the circuit board test point to be contacted is detected in each case.

18. Apparatus according to claim 15, wherein for each batch of circuit boards to be tested, the calibration data for the first circuit board of the batch to be tested are determined with the aid of ten to 100 circuit board test points, with this calibration data being used for the testing of further circuit boards of the batch.

19. Apparatus according to claim 18, wherein in the testing of further circuit boards of the batch, calibration data are determined with the aid of a number of circuit board test points which is reduced in steps between the testing of each circuit board.

20. Method for the testing of circuit boards with an apparatus for the testing of circuit boards, comprising: a mounting area for holding a circuit board to be tested; test fingers for the serial contacting of circuit board test points of a circuit board to be tested by means of corresponding a contact tips, wherein the test fingers are capable of being moved along the surface of a circuit board to be tested by means of a movement device and contacting the circuit board with the contact tips; and an optical detection device for the optical detection of the position of at least one of the contact tips of the test fingers, in which a method for approaching selected circuit board test points with a contact tip comprises:
    execution of a positioning movement of one of the contact tips, which is arranged at a distance from the surface of a circuit board to be tested, wherein the contact tip is moved parallel to the surface of the circuit board until the contact tip is positioned approximately on a solder standing vertically in the center of a circuit board test point;
    moving the optical detection device with the contact tip;
    moving the contact tip at right-angles to the surface of the circuit board to be tested wherein the optical detection device determines the position of the contact tip relative to the circuit board test point to be contacted at least once, and the movement device for executing a correction movement directed parallel to the surface of the circuit board to be tested is driven in such a way that the contact tip is moved towards the solder.

21. Method according to claim 20, wherein from the direction and amount of the correction movement, calibration data are determined for use in subsequent positioning movements.

22. Method according to claim 21, wherein the correction movement for correcting the position of a contact tip is executed in several movement steps wherein, between the individual movement steps, the position of the probe tip relative to the circuit board test point to be contacted is detected in each case.

23. Method according to claim 22, wherein for each batch of circuit boards to be tested, the calibration data for the first circuit board of the batch to be tested are determined with the aid of ten to 100 circuit board test points, with this calibration data being used for the testing of further circuit boards of the batch.

24. Method according to claim 23, wherein in the testing of further circuit boards of the batch, calibration data are determined with the aid of a number of circuit board test points which is reduced in steps between the testing of each circuit board.

25. Method according to claim 23, wherein in the testing of further circuit boards of the batch, calibration data are determined with the aid of two to ten circuit board test points.

26. Method according to claim 25, wherein in the testing of further circuit boards of the batch, calibration data are determined with the aid of an increased number of circuit board test points if a fault occurs in the contacting of a circuit board test point by a test finger.

27. Method according to claim 21, wherein for each batch of circuit boards to be tested, the calibration data for the first circuit board of the batch to be tested are determined with the aid of ten to 100 circuit board test points, with this calibration data being used for the testing of further circuit boards of the batch.

28. Method according to claim 27, wherein in the testing of further circuit boards of the batch, calibration data are determined with the aid of two to ten circuit board test points.

29. Method according to claim 28, wherein in the testing of further circuit boards of the batch, calibration data are determined with the aid of a number of circuit board test points which is reduced in steps between the testing of each circuit board.

30. Method according to claim 29, wherein in the testing of further circuit boards of the batch, calibration data are determined with the aid of an increased number of circuit board test points if a fault occurs in the contacting of a circuit board test point by a test finger.

31. Method according to claim 20, wherein the correction movement for correcting the position of a contact tip is executed in several movement steps wherein, between the individual movement steps, the position of the probe tip relative to the circuit board test point to be contacted is detected in each case.

32. A finger tester, comprising:
    a mounting area for holding a circuit board to be tested;
    a test head;
    a test probe being mounted on the test head, the test probe comprising a contact tip for the contacting of a circuit board test point of the circuit board to be tested held in the mounting area, wherein the test probe moves along a surface of the circuit board to be tested and perpendicular to the surface so that the contact tip contacts the circuit board test points;
    an optical detection device for the test probe that moves with the test probe at least in a direction along the surface of the circuit board to be tested for optically detecting the contact tip relative to the circuit board test point; and
    a control unit controlling movement of the contact tip based on an optically detected relationship between the contact tip and the test point that is detected by the optical detection device.

33. Test probe according to claim 32, characterised in that the detection device has a receiver device which is in the form of a camera chip.

34. Test probe according to claim 32, characterised in that the detection device has a receiver device which is in the form of an optical fiber cable.

* * * * *

UNITED STATES PATENT AND TRADEMARK OFFICE
CERTIFICATE OF CORRECTION

| | | |
|---|---|---|
| PATENT NO. | : 7,015,711 B2 | |
| APPLICATION NO. | : 10/981079 | |
| DATED | : March 21, 2006 | |
| INVENTOR(S) | : Uwe Rothaug and Oleh Yuschuk | |

It is certified that error appears in the above-identified patent and that said Letters Patent is hereby corrected as shown below:

In claim 1, column 9, line 59, after "fingers," insert ---the---.

In claim 11, column 10, line 39, delete "end" and insert ---and---.

In claim 20, column 11, line 20, after "corresponding," delete "a".

Signed and Sealed this

First Day of August, 2006

JON W. DUDAS
*Director of the United States Patent and Trademark Office*